United States Patent [19]
Kim et al.

[11] Patent Number: 6,004,867
[45] Date of Patent: Dec. 21, 1999

[54] CHIP-SIZE PACKAGES ASSEMBLED USING MASS PRODUCTION TECHNIQUES AT THE WAFER-LEVEL

[75] Inventors: Sam Il Kim, Chungcheongnam-do; Young Rae Cho, Seoul, both of Rep. of Korea

[73] Assignee: Samsung Electronics Co., Ltd., Suwon, Rep. of Korea

[21] Appl. No.: 08/990,070

[22] Filed: Dec. 12, 1997

[30] Foreign Application Priority Data

Dec. 16, 1996 [KR] Rep. of Korea .................. 96-66316

[51] Int. Cl.[6] ........................................ H01L 21/30
[52] U.S. Cl. ..................... 438/459; 438/458; 438/464
[58] Field of Search ................................. 438/113, 114, 438/458, 459, 460, 462, 464, 465

[56] References Cited

U.S. PATENT DOCUMENTS

| | | | |
|---|---|---|---|
| 5,024,970 | 6/1991 | Mori ........................................ | 438/462 |
| 5,223,450 | 6/1993 | Fusino et al. ........................... | 438/459 |
| 5,270,261 | 12/1993 | Bertin et al. ........................... | 438/459 |
| 5,346,848 | 9/1994 | Grupen-Shemansky et al. ...... | 438/459 |
| 5,691,248 | 11/1997 | Cronin et al. ........................... | 438/465 |

FOREIGN PATENT DOCUMENTS

| | | |
|---|---|---|
| 8-288424 | 11/1996 | Japan . |
| 9-64049 | 3/1997 | Japan . |
| 9-172036 | 6/1997 | Japan . |
| 10-32224 | 2/1998 | Japan . |
| 10-98132 | 4/1998 | Japan . |

OTHER PUBLICATIONS

Robert T. Crowley et al., "Chip–Size Packaging Developments", TechSearch International, Inc., Aug. 1995, pp. 1–4.

*Primary Examiner*—Kevin M. Picardat
*Attorney, Agent, or Firm*—Jones Volentine, LLP

[57] ABSTRACT

A chip-size package includes a semiconductor chip having a plurality of input/output pads on an active surface and a passivation layer covering the active surface such that the pads are exposed. Attached to the chip is a substrate having a plurality of electrically conductive traces and corresponding terminal pads therein. A bottom portion of each of the traces is exposed at the bottom surface of the substrate so that the traces are mechanically and electrically bonded to one of the input/output pads. The terminal pads are formed on a top portion of each of the traces and are exposed to a top surface of the substrate. Accordingly, the terminal pads are not limited to being located over the center or the periphery of the chip where the input/output pads are located, but rather can be arranged over the entire area of the chip to produce a chip-size package capable of mass production.

15 Claims, 5 Drawing Sheets

CHIP-SIZE PACKAGES ASSEMBLED USING MASS PRODUCTION TECHNIQUES AT THE WAFER-LEVEL

BACKGROUND OF THE INVENTION

1. Field of the Invention

The present invention relates generally to semiconductor chip packages, and more particularly, to methods for manufacturing chip-size packages at a wafer-level and the resulting chip-size package structures.

2. Description of the Related Art

The major trend in the electronics industry today is to make products lighter, smaller, faster, more multi-functional, more powerful, more reliable, and less expensive. One of the key technologies to make these product design goals possible is electronic packaging and assembly technology.

One particular packaging technology, chip-size or chip-scale packaging (CSP), has many advantages compared to conventional packaging such as quad flat packaging (QFP), ball grid array (BGA), and the like. The most obvious advantage is the size of the package, that is, the package is the same size as the chip or slightly larger. Another advantage of CSP is that the package facilitates test and burn-in before assembly as an alternative to known good die (KGD) testing. In addition, CSP can combine many of the benefits of surface mount technology (SMT), such as standardization, encapsulation, surface mount, and reworkability, with the benefits of flip chip technology, such as low inductance, high I/O count, and direct thermal path. Further background information is available in "Chip-Size Packaging Developments", August 1995, TechSearch International, Inc.

However, CSP has at least one disadvantage compared to conventional SMT and flip chip technology, namely, high cost per unit. However, this problem could be eliminated if chip-sized packages could be mass produced more easily.

In many cases, the connections between circuit boards and CSP devices are accomplished using metallic bumps. One of the limitations of many CSP production methods is the need for flexibility in the number, arrangement, and size of metallic bumps that can be disposed on a CSP device.

A need exists therefore, for a CSP device that allows for flexible arrangement of metallic bumps and that can be mass produced at the wafer level.

SUMMARY OF THE INVENTION

It is therefore an object of the present invention to provide chip-size packages and methods of manufacturing chip-size packages which enable mass production at low cost.

To achieve these and other objects, the present invention provides a chip-size package comprising a semiconductor chip having a plurality of input/output pads on an active surface thereof, and a passivation layer covering the active surface such that the input/output pads are exposed. The chip-size package further comprises a plurality of electrically conductive traces and corresponding terminal pads in a substrate having a bottom surface and a top surface.

A bottom portion of each of the traces is exposed at the bottom surface. The bottom surface of the substrate is attached to the passivation layer so that the bottom portion of each of the traces is mechanically and electrically bonded to a respective one of the input/output pads. The terminal pads are formed on a top portion of each of the traces and are exposed to a top surface of the substrate. A plurality of metallic bumps are formed on a top portion of respective ones of the terminal pads, so that each of the bumps is electrically connected with a respective one of the input/output pads of the semiconductor chip through the respective one of the traces and the terminal pads.

In other aspects of the invention, the traces are comprised of a plurality of horizontal trace layers, the terminal pads are located over an area on the top surface of the substrate independently of the positions of the input/output pads, where the area of the substrate is the same as the area of the chip, and a barrier metal layer is interposed between each of the traces and the respective input/output pad.

Another aspect of the invention is a method to manufacture the chip-size package comprising steps of providing a wafer, attaching a substrate to form a substrate-wafer-composite, lapping the substrate, forming a plurality of metallic bumps, and cutting the substrate-wafer-composite. Additional steps include polishing the wafer, laying a barrier metal layer, and lapping a surface of the wafer opposite the surface attached to the substrate.

BRIEF DESCRIPTION OF THE DRAWINGS

The foregoing and other objects, aspects, and advantages will be described with reference to the drawings, in which:

FIGS. 5A through 5E are cross-sectional views illustrating steps of a method for manufacturing the chip-size package at the wafer-level according to the present invention, in which FIG. 5A is a cross-sectional view taken along the line V—V of FIG. 4, and illustrates a step of providing a wafer including a plurality of semiconductor chips, FIG. 5B illustrates a step of polishing the top surface of the wafer of FIG. 5A, FIG. 5C illustrates a step of attaching a substrate having a plurality of electrically conductive traces to the wafer, FIG. 5D illustrates a step of lapping the substrate-wafer-composite, and FIG. 5E illustrates a step of cutting the substrate-wafer-composite for providing individual chip-size packages, after forming metallic bumps on the substrate.

DETAILED DESCRIPTION OF PREFERRED EMBODIMENT

Figure 1:
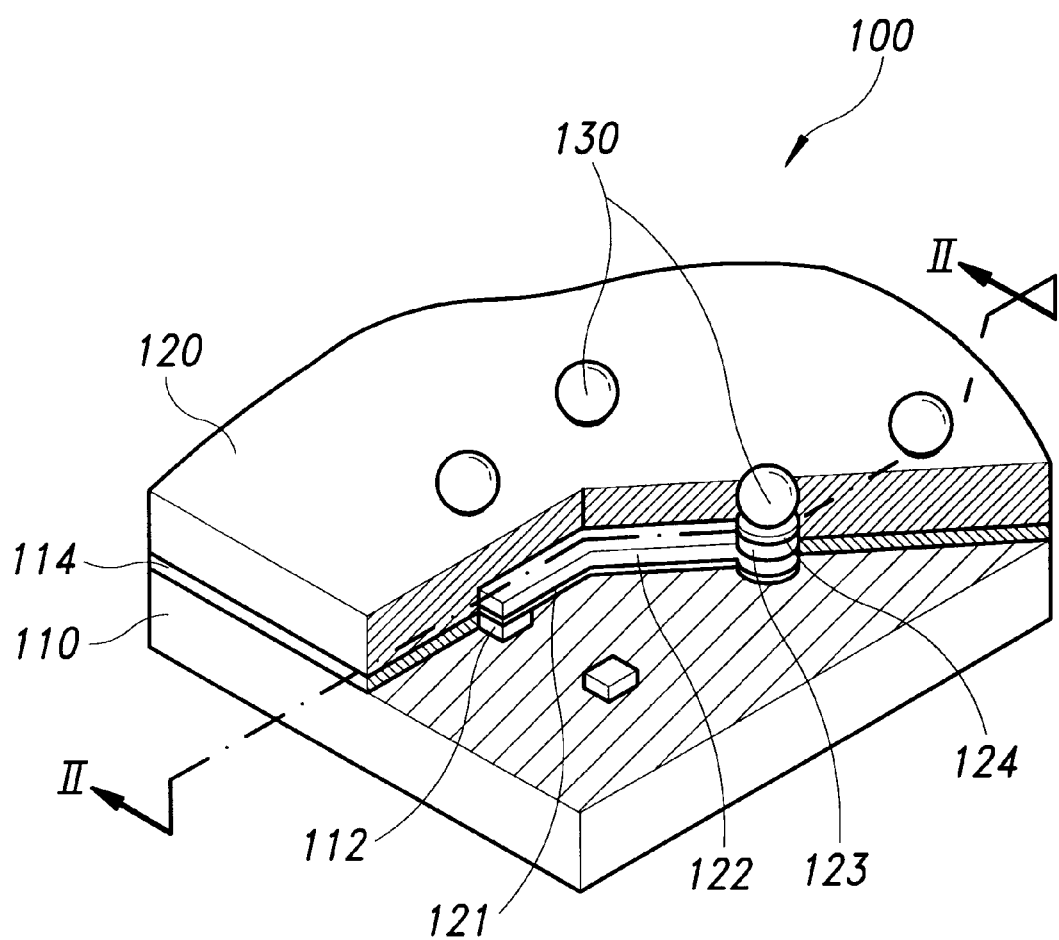
FIG. 1 is a perspective view, partially cut away, of one embodiment of a chip-size package according to the present invention, assembled at the wafer-level.

The present invention is directed to a chip-size package assembled at the wafer-level that allows for flexible arrangement of metallic bumps and that can be mass produced at the wafer level. The present invention will now be described more fully with reference to the accompanying drawings, in which preferred embodiments of the invention are shown. In the drawings, like numbers refer to like elements throughout.

Figure 2:
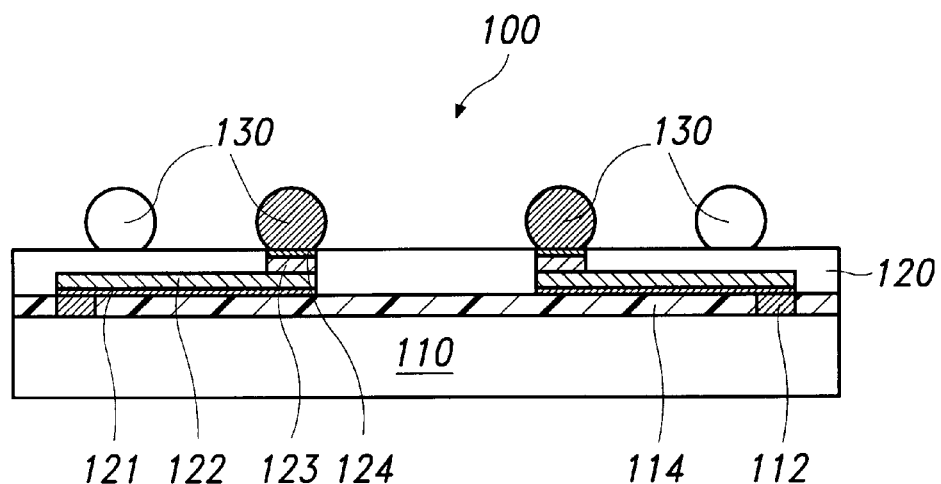
FIG. 2 is a cross-sectional view taken along the line II—II of FIG. 1.

As shown in FIG. 1 and FIG. 2, the chip-size package 100 comprises a semiconductor chip 110 and a substrate 120. A plurality of input/output pads 112 are formed on the active surface of the chip 110, and a passivation layer 114 covers the active surface while leaving the input/output pads 112 exposed.

Figure 3:
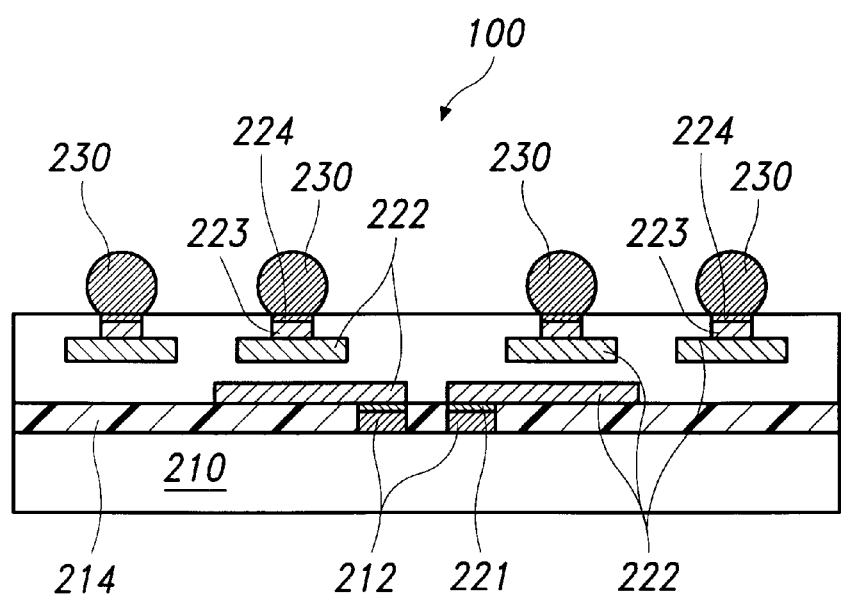
FIG. 3 is a cross-sectional view of another embodiment of the chip-size package according to the present invention, assembled at the wafer-level.

The dielectric passivation layer 114, such as an SiO$_2$ or Si$_3$N$_4$ layer, protects circuits in and on the chip 110 and is formed by performing a conventional chemical vapor deposition (CVD) process. The input/output pads 112 provide paths for electrical currents and signals between the circuits of the chip 110 and those of the main circuit board (not shown). The input/output pads 112, made of a metal such as Aluminum (Al) for example, can be formed on either a peripheral or central area of the active surface. The pads 112 shown in FIG. 1 and FIG. 2 are peripheral pads while central pads 212 are shown in FIG. 3. The chip 110 normally has a square or rectangular shape.

The substrate 120 is also a thin square or rectangular plate which has top and bottom planar surfaces and a plurality of electrically conductive traces 122 and corresponding terminal pads 124 therein. The electrically conductive traces 122 can be freely patterned in the substrate 120, and are formed in at least one horizontal layer. One portion of each trace 122 is exposed at the bottom surface of the substrate 120, while each terminal pad 124 is formed on another portion of each corresponding trace 122 and then exposed at the top surface of the substrate 120. Furthermore, each trace 122 and each corresponding terminal pad 124 may be electrically connected through an interconnection via 123 interposed therebetween.

When the traces 122 do not cross each other, such as shown by the trace pattern in FIG. 1, the traces 122 may be formed in a single layer through the substrate 120. But, when the traces 122 must cross, for example, due to the physical requirements of a particular chip's signal pattern, the traces 122 must be formed in more than one horizontal trace layer that are vertically separated from each other through the substrate 120. In this way, the current-carrying trace paths can cross horizontally while preserving electrical isolation by means of the vertical separation afforded by the substrate material. FIG. 3 is an example of traces 222 formed in two horizontal layers while maintaining a vertical separation therebetween.

The bottom surface of the substrate contacts and adheres to the passivation layer 114 in such a manner that the bottom portion of the traces 122 contact the exposed input/output pads 112 of the active surface of the chip 110. Accordingly, the traces 122 on the bottom surface of the substrate 120 can be bonded to the corresponding input/output pads 112 on the chip 110 using a thermo-compression method for example.

The package 100 of the present invention thus has direct electrical contact between the input/output pads 112 of the chip 110 and the electrically conductive traces 122 of the substrate 120 without any further electrical connections. The substrate 120 is preferably made of silicon, like the chip 110, in order to endure the high temperature conditions during the thermo-compression process. Further, since the traces 122 in the substrate 120 overlying the active surface of the chip 110 can be located anywhere in the substrate 120, the active surface of the chip 110 and the top and bottom surfaces of the substrate 120 all can have the same area, thereby providing a chip-sized package. In addition to providing the electrically conductive traces 122, the substrate 120 protects the active surface of the chip 110 from hostile environments and strengthens the package 100. Therefore, other conventional encapsulating methods are not needed.

The traces 122 in the substrate 120 may be formed by sputtering or depositing metals such as copper (Cu), gold (Au), nickel (Ni), platinum (Pt), and the like. Moreover, between the trace 122 of the substrate 120 and the pad 112 of the chip 110, one or more barrier metal layers 121 can be interposed for enhanced bonding strength as needed. The barrier metal layer 121 can be deposited or sputtered on the traces 122 in the substrate 120, as shown in FIG. 1 and FIG. 2, or on the pad 112 of the chip 110, or both. FIG. 3 shows an example of a barrier metal layer 221, disposed on the input/output pads 212 of a semiconductor chip 210, below the top level of a passivation layer 214. Various metals can be used for the barrier layer 121 as needed.

The terminal pads 124 provide electrical routing and mechanical joining between the package 100 of the present invention and the main circuit board (not shown). The interconnection vias 123 provide electrical routing between the traces 122 and the terminal pads 124. The pads 124 and the vias 123 may be formed by sputtering, depositing or plating metals such as gold (Au), nickel (N), copper (Cu), and the like. The substrate 120, including traces 122, terminal pads 124 and vias 123, can therefore be formed with wafer-level processes amenable to mass production. In particular, the freedom of patterning of the traces 122 allows the terminal pads 124 to be disposed anywhere on the top surface of the substrate 120, independently of the positions of the input/output pads 112 on the active surface of the chip 110. That is, the terminal pads 124 have an area configuration on the substrate 120, whereby they are not confined to only the center or periphery of the chip.

Referring again to FIG. 1 and FIG. 2, a plurality of metallic bumps 130 may be formed on a top portion of the terminal pads 124 which are exposed at the top surface of the substrate 120. The exposed top portion of the terminal pads 124 can be flush or co-planar with the top surface of the substrate as show in FIG. 2. A plurality of metallic pins may be alternately used instead of the bumps 130.

Each of the metallic bumps 130 corresponds to one terminal pad 124 on the top surface of the substrate 120. Consequently, each bump 130 is electrically connected to one input/output pad 112 of the chip 110 through the trace 122, the via 123 and the pad 124. Each bump 130 is then mechanically and electrically bonded to the main circuit board (not shown).

FIG. 3 shows another embodiment of the chip-size package 200 according to the present invention, assembled at the wafer-level. Referring to FIG. 3, input/output pads 212 of a semiconductor chip 210 of this embodiment are formed on a central area of the active surface of the chip 210, while those of the previous embodiment in FIG. 2 were formed on a peripheral area. Electrically conductive traces 222 are formed into two vertically separated layers in a substrate 220, so that traces 222 in the separated layers can cross horizontally without making electrical contact due to the vertical separation. Therefore bumps 230 can be placed freely on the top surface of the substrate 220, independent of the position of the input/output pads 212. If necessary, vertical connections between the vertically separated trace layers can be accomplished with through-holes (not shown). A barrier metal layer 221 may be provided on the input/output pads 212 to enhance bonding. The terminal pads 224 and the interconnection vias 223 are provided on the upper trace layer 222. The passivation layer 214 and metallic bumps 230 are otherwise like those in the previous embodiment so they will not be discussed further.

These chip-sized packages, as explained above, may be assembled at the wafer level to enable the mass production of the packages to thereby in turn lower production costs.

Figure 4:
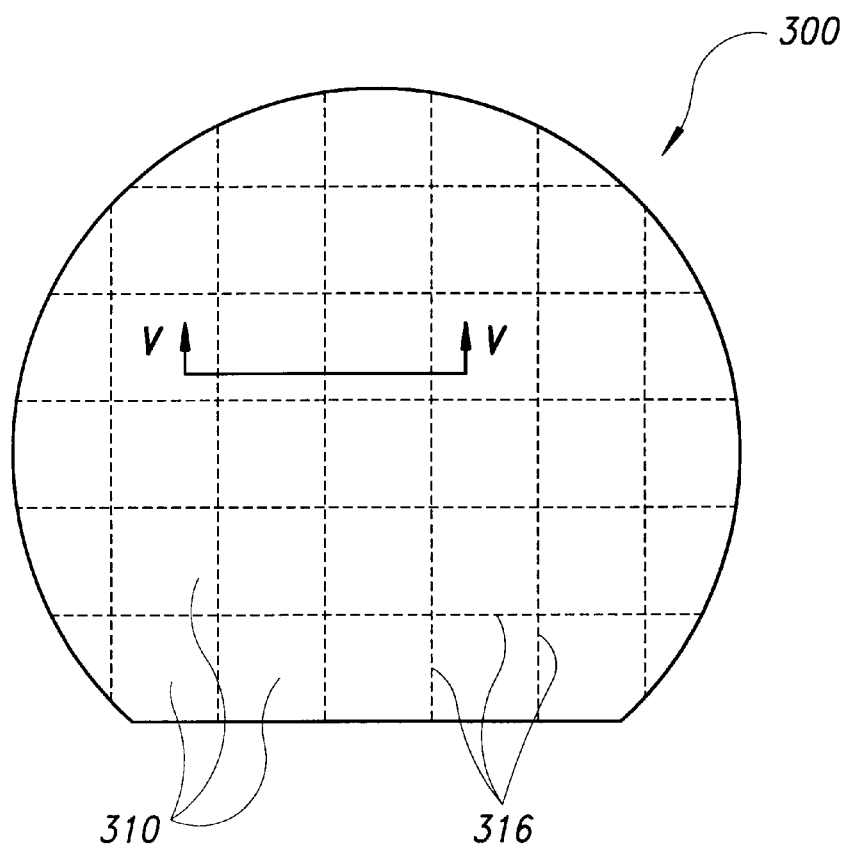
FIG. 4 is a plan view of a conventional wafer.

A method for manufacturing the packages at the wafer-level will now be described. FIG. 4 is a plan view of a conventional wafer 300, and FIG. 5A through FIG. 5E are cross-sectional views illustrating steps of a method for manufacturing the chip-size package according to the present invention. In particular, FIG. 5A, which is a cross-sectional view taken along the line V—V of FIG. 4, illustrates a step of providing a wafer 300 including a plurality of semiconductor chips 310. FIG. 5B illustrates a step of polishing the top surface of the wafer 300 of FIG. 5A. FIG. 5C illustrates a step of attaching a substrate 320 having a plurality of electrically conductive traces 322 to the wafer 300 to produce a substrate-wafer-composite 390. FIG. 5D illustrates a step of back-lapping the substrate-wafer-composite 390. FIG. 5E illustrates a step of cutting the substrate-wafer-composite 390 for providing the individual chip-size packages, after forming metallic bumps 330 on the substrate 320.

Figure 5A:
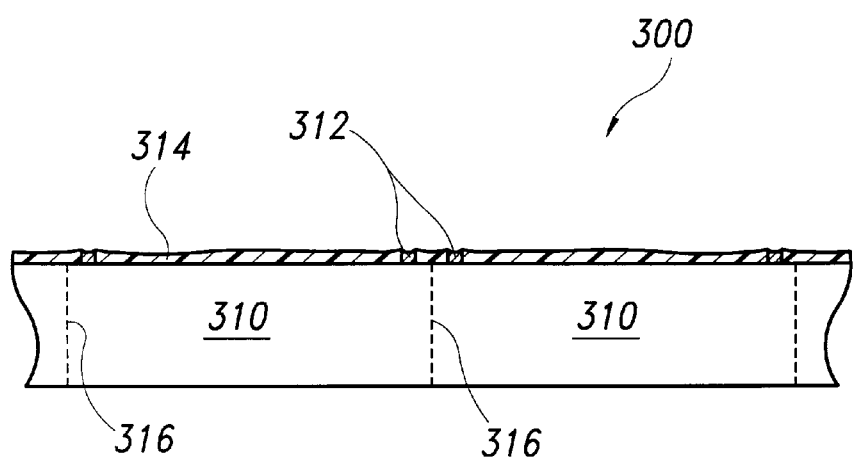
Figure 5B:
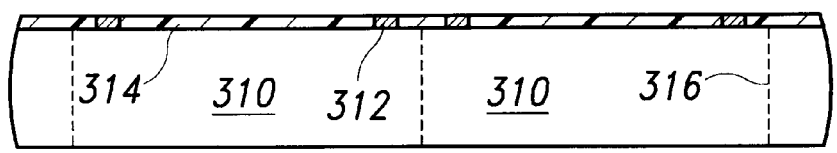
Figure 5C:
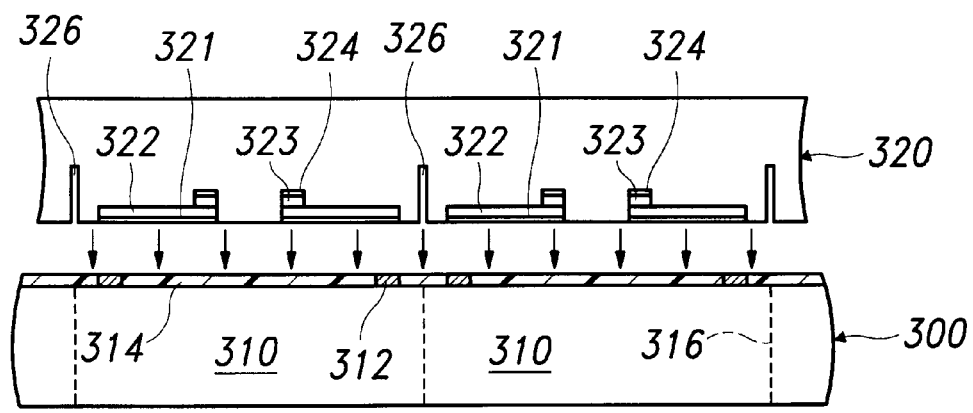
Figure 5D:
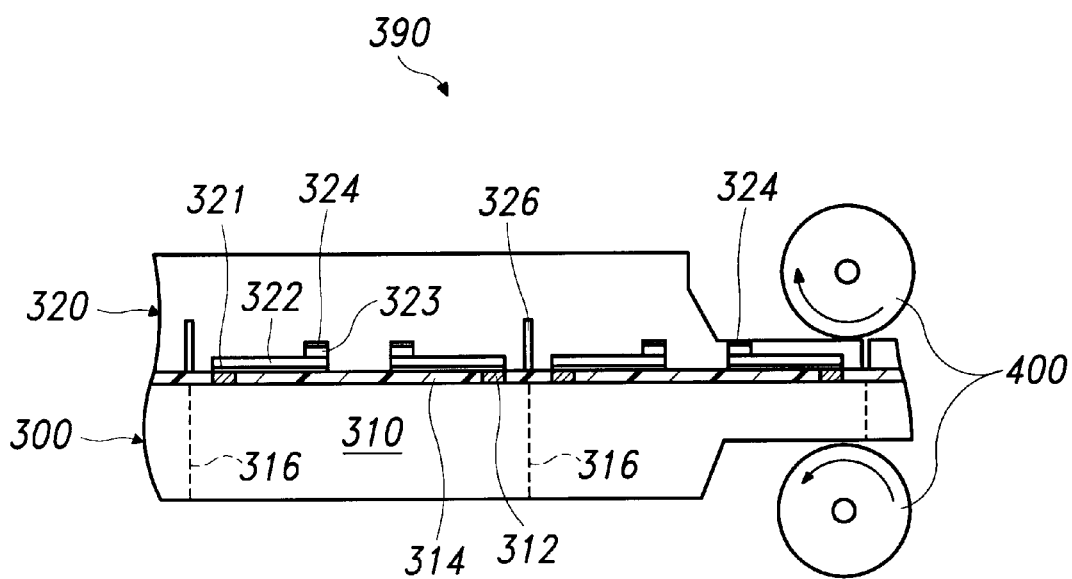
Figure 5E:
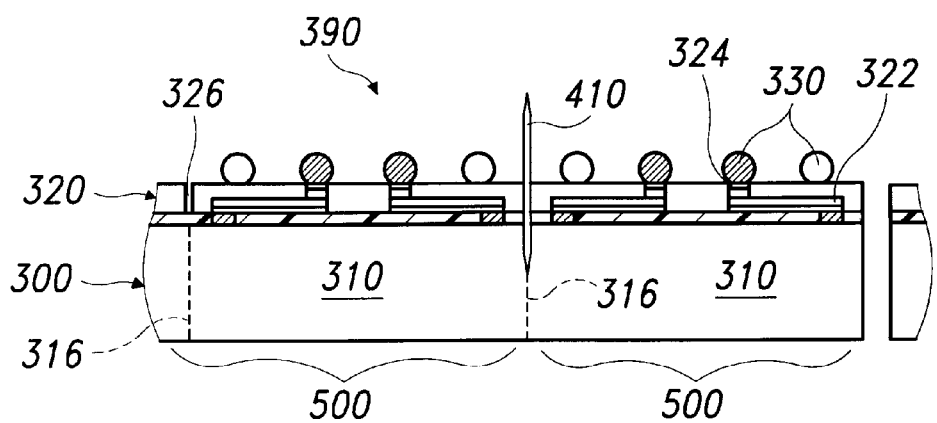

As seen from FIGS. 4 and 5A, the wafer 300, usually made from silicon ingot, includes a plurality of semiconductor chips 310 in which predetermined circuits are integrated. Each semiconductor chip 310 has input/output pads 312 on an active surface thereof, and a passivation layer 314 covering the active surface so that the input/output pads 312 are exposed. Each chip 310 is separated from the others by scribe lines 316. The scribe lines 316 between the chips 310 are elongated regions of the wafer in which circuits are not formed. In the drawings, the scribe lines 316 are shown as dotted lines for convenience.

As illustrated in FIG. 5B, the wafer 300 is preferably polished to make its top surface flat before it is attached to the substrate. In the preferred embodiment, the polishing step may be conducted by using a chemical/mechanical or mechanical polishing process. The surface formed by the top of the passivation layer 314 and the top of the input/output pads 312 then becomes flat. The polished surface allows for more complete and reliable bonding between the substrate 320 and the wafer 300 as illustrated in FIG. 5C.

The substrate 320 includes a top surface and a bottom surface with the electrically conductive traces 322 being exposed through the bottom surface. The substrate 320 is positioned above the wafer 300 and then the bottom surface of the substrate 320 is attached to the active surface of the wafer 300, more specifically, to the passivation layer 314 and the input/output pads 312 disposed on the active surface of the wafer 300. The bottom portions of the traces 322 in the substrate 320 thus contact the passivation layer 314 and the input/output pads 312 disposed on the active surface of the wafer 300.

Accordingly, the traces 322 of the substrate 320 can be mechanically and electrically bonded to the corresponding pads 312 of the chip 310. High temperature S processes such as thermo-compression are used in the preferred embodiment for intimate contact between the two metal surfaces. Since the thermal process is generally conducted at very high temperatures, about 300° C. to about 1,000° C., a thermal-resistant material such as silicon is used for the substrate 320 in the preferred embodiment.

A terminal pad 324 is formed on the top portion of the trace 322 in the substrate 320. Furthermore, an interconnection via 323 may be interposed between the trace 322 and the terminal pad 324 to provide electrical routing therebetween. The terminal pads 324 will provide electrical and mechanical bonding between the package of the present invention and the main circuit board (not shown) after fabrication of the package.

One or more barrier metal layers 321 can be interposed between the trace 322 of the substrate 320 and the pad 312 of the chip 310 as required, so as to enhance bonding strength. The barrier metal layer 321 can be formed on the traces 322 or on the pads 312, or both, by using a deposition or sputter process before the step of attaching the wafer 300 to the substrate 320.

Furthermore, the substrate 320 may include grooves 326 which are open to the bottom surface of the substrate 320 and correspond in positions to the scribe lines 316 of the wafer 300. In a similar fashion, index-patterns, composed of, for example, plated through-holes, may be formed in the substrate 320. The grooves 326 or index patterns can be formed by using laser drilling or etching techniques when the traces are formed in the substrate 320. The grooves 326 or index-patterns make it easier to distinguish between upper and lower parts of the substrate 320 and wafer 300, and facilitate the cutting of the wafer 300.

As shown in FIG. 5D, after the substrate 320 is firmly attached to the wafer 300, a substrate-wafer-composite 390 is formed. The top surface of the substrate 320 is back-lapped so that the terminal pads 324 in the substrate 320 are exposed. Accordingly, electrical connection paths to the main board (not shown) can be obtained through the exposed terminal pads 324. In addition, the wafer 300 side of the substrate-wafer-composite 390 can be back-lapped to produce a thinner chip package. The back-lapping of the substrate 320 may be performed before, after, or simultaneously with the back-lapping of the wafer 300. Special means, such as tape, are required in conventional wafer back-lapping processes for protecting the active surface of the chip, but are not required in the back-lapping process of the present invention due to the protection afforded by the attached substrate 320.

The downwardly opened grooves 326 in the substrate 320 are upwardly opened, i.e., turned into through-holes, after the back-lapping of the substrate 320 side of the composite 390. This means that the scribe lines 316 of the wafer 300 are exposed through the grooves 326 in the substrate 320 for easier cutting of the substrate-wafer-composite 390. Therefore, the depth of the grooves 326 before lapping is preferably greater than or equal to the distance between the bottom surface of the substrate 320 and the top portions of the terminal pads 324. Alternatively, the index-patterns can indicate lines for cutting, even though the scribe lines 316 of the wafer 300 are not exposed.

As shown in FIG. 5E, a plurality of metallic bumps 330 are formed on the terminal pads 324 in the top surface of the substrate 320. The substrate-wafer-composite 390 is then cut along the scribe lines 316 of the wafer 300, preferably using a diamond blade 410. Accordingly, individual packages 500 are provided from the wafer 300. Furthermore, as previously described, the grooves 326 or the index-patterns facilitate the cutting of the substrate-wafer-composite 390 along the scribe lines 316 of the wafer 300.

Each bump 330 on the terminal pads 324 is electrically connected to one corresponding pad 312 of the chip 310 through the corresponding trace 322. The bumps mechanically and electrically interconnect the package 500 and the main circuit board (not shown) after completion of the package assembly. Metals such as solder, gold, and the like may be used for the metallic bumps 330. The solder bumps can be formed by solder reflow after mounting or screen printing, while gold bumps can be formed by electroplating or photo-masking. A plurality of metallic pins (not shown) may be alternately formed on the terminal pads 324 instead of the bumps 330.

Because the above described manufacturing steps are amenable to processing at the wafer level, the chip-size package embodiments of the present invention, including the package 100 of FIG. 1 and the package 200 of FIGS. 2 and 3, can be mass produced at low cost.

The semiconductor chip packages of the present invention can thus be used to provide a chip-size package with physical dimensions on the order of those of the semiconductor chip. Accordingly, a highly integrated semiconductor chip can be electrically and mechanically connected to a main board while occupying a relatively small surface area of the main board.

In the drawings and specification, there have been disclosed typical, preferred, and specific embodiments of the invention in the manner of examples. Although specific terms are employed, they are used for descriptive purposes only and not for purposes of limitation. It will be apparent to those skilled in the art that many various modifications and variations can be made in the packages and methods of the present invention without departing from the spirit or scope of the invention. Thus, it is intended that the present invention cover the modifications and variations of this invention provided they come within the scope of the appended claims and their equivalents.

What is claimed is:

1. A method for manufacturing chip-size packages at a wafer-level, comprising steps of:

providing a wafer including a plurality of semiconductor chips and a plurality of scribe lines between the semiconductor chips, wherein each of the semiconductor chips has a plurality of input/output pads on an active surface thereof and a passivation layer covering the active surface such that the input/output pads are exposed;

attaching a substrate to the wafer to form a substrate-wafer-composite, the substrate including a bottom surface, a top surface, and a plurality of electrically conductive traces and corresponding terminal pads therein, wherein each of the terminal pads is formed on a top portion of each corresponding trace, and wherein a bottom portion of each of the traces is exposed at the bottom surface and the bottom surface is attached to the passivation layer, so that the traces are mechanically and electrically bonded to respective ones of the input/output pads;

back-lapping the top surface of the substrate so that a top portion of each of the terminal pads is exposed; and cutting the substrate-wafer-composite along the scribe lines so that individual packages are separated from the substrate-wafer-composite.

2. The method of claim 1, further comprising a step of polishing an outer surface of the passivation layer and the input/output pads to make the outer surface of the passivation layer flat before the attaching step.

3. The method of claim 2, wherein the polishing step is conducted by using one of a chemical/mechanical polishing process and a mechanical polishing process.

4. The method of claim 1, wherein the attaching step is performed under high temperature conditions.

5. The method of claim 1, the substrate further comprising a plurality of grooves exposed at the bottom surface of the substrate, each of the grooves corresponding to respective ones of the scribe lines, and during the attaching step, each of the grooves being substantially aligned with the respective ones of the scribe lines.

6. The method of claim 5, wherein each of the grooves has a predetermined depth greater than a predetermined distance between the bottom surface of the substrate and the top portion of the terminal pads, so that the grooves are exposed at the top surface of the substrate after the substrate back-lapping step, such that the scribe lines in the wafer are exposed through the grooves.

7. The method of claim 6, wherein the cutting step is performed along the scribe lines exposed through the grooves.

8. The method of claim 1, wherein the substrate further comprises a plurality of index-patterns, each of the index-patterns corresponding to respective ones of the scribe lines, and wherein the cutting step is performed along the index patterns.

9. The method of claim 1, further comprising a step of forming a barrier metal layer on said traces before the attaching step.

10. The method of claim 1, further comprising a step of forming a barrier metal layer on said input/output pads before the attaching step.

11. The method of claim 1, further comprising a step of back-lapping a wafer surface opposite to the active surface of the wafer after the attaching step to reduce the thickness of the wafer.

12. The method of claim 11, wherein the wafer back-lapping step and the substrate back-lapping step are performed simultaneously.

13. The method of claim 11, wherein the wafer back-lapping step is performed after the substrate back-lapping step.

14. The method of claim 11, wherein the wafer back-lapping step is performed before the substrate back-lapping step.

15. The method of claim 1, further comprising a step of forming a plurality of metallic bumps on the top portions of the terminal pads after the back-lapping step, so that each of the bumps is electrically connected with the respective ones of the input/output pads through respective ones of the terminal pads.

* * * * *